US012000909B2

(12) United States Patent
Quandt et al.

(10) Patent No.: US 12,000,909 B2
(45) Date of Patent: Jun. 4, 2024

(54) MEASURING DEVICE FOR WEAK AND SLOWLY CHANGING MAGNETIC FIELDS, IN PARTICULAR FOR BIOMAGNETIC FIELDS

(71) Applicant: Christian-Albrechts-Universitaet zu Kiel, Kiel (DE)

(72) Inventors: Eckhardt Quandt, Heikendorf (DE); Reinhard Knoechel, Elmshorn (DE); Patrick Hayes, Schoenkirchen (DE); Sebastian Toxvaerd, Kolding (DK)

(73) Assignee: Christian-Albrechts-Universitaet zu Kiel, Kiel (DE)

( * ) Notice: Subject to any disclaimer, the term of this patent is extended or adjusted under 35 U.S.C. 154(b) by 187 days.

(21) Appl. No.: 17/621,298

(22) PCT Filed: Jun. 9, 2020

(86) PCT No.: PCT/DE2020/100483
§ 371 (c)(1),
(2) Date: Dec. 21, 2021

(87) PCT Pub. No.: WO2020/253908
PCT Pub. Date: Dec. 24, 2020

(65) Prior Publication Data
US 2022/0291302 A1 Sep. 15, 2022

(30) Foreign Application Priority Data

Jun. 21, 2019 (DE) .................... 10 2019 116 779.5

(51) Int. Cl.
*G01R 33/028* (2006.01)
*H10N 30/00* (2023.01)
*G01R 33/18* (2006.01)

(52) U.S. Cl.
CPC ......... *G01R 33/0286* (2013.01); *H10N 30/00* (2023.02); *G01R 33/18* (2013.01)

(58) Field of Classification Search
None
See application file for complete search history.

(56) References Cited

U.S. PATENT DOCUMENTS

| 11,456,408 B1 * | 9/2022 | Yoo | H10N 35/85 |
| 2007/0252593 A1 * | 11/2007 | Takeuchi | G01R 33/18 324/249 |

(Continued)

FOREIGN PATENT DOCUMENTS

GB 2319621 A 5/1998

OTHER PUBLICATIONS

International Search Report issued on Sep. 11, 2020, in International Application No. PCT/DE2020/100483.

(Continued)

*Primary Examiner* — Jas A Sanghera
(74) *Attorney, Agent, or Firm* — Stephan A. Pendorf; Patent Central LLC

(57) ABSTRACT

A magnetic field measuring device having a cantilevered, mechanically vibratable, rectangular substrate strip, at least one flat side of the substrate strip being coated with a magnetostrictive material system, further having drive means designed for the temporally periodic exertion of a force component directed perpendicular to the flat sides of the substrate strip on at least one part of a flat side of the substrate strip with a predetermined excitation frequency and having a detection device for detecting an electrical signal generated by the vibration of the substrate strip, wherein a. the substrate strip is formed from a material with a modulus of elasticity greater than 5 GPa and b. the excitation frequency is set up as a function of the dimensions (Continued)

Figure 1A:
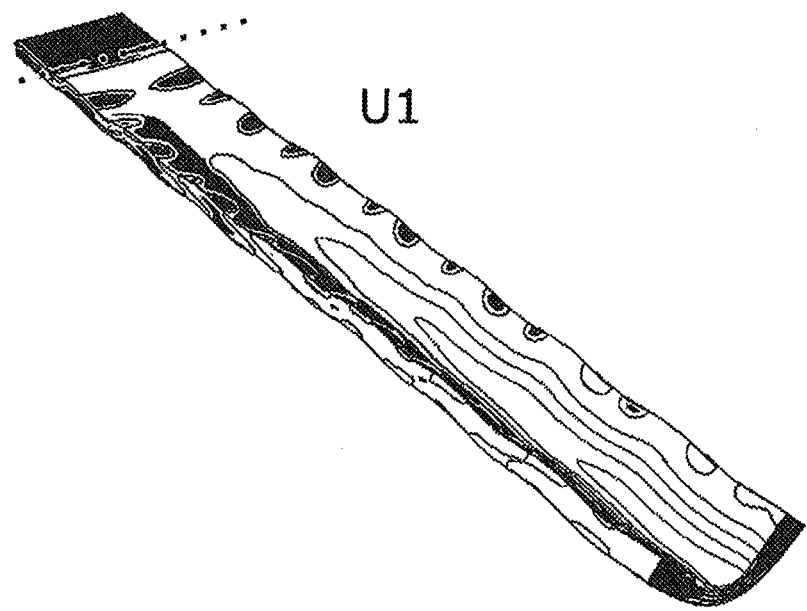

of the substrate strip in such a way that the substrate strip oscillates in mechanical resonance and forms a U-mode, and
c. the detection device has an induction coil which surrounds the substrate strip in a contactless manner and has a coil axis aligned along the substrate strip.

11 Claims, 5 Drawing Sheets

(56) References Cited

U.S. PATENT DOCUMENTS

| | | | |
|---|---|---|---|
| 2008/0148864 A1* | 6/2008 | Fleury | B81C 1/00666 |
| | | | 73/818 |
| 2009/0015250 A1 | 1/2009 | Sunier et al. | |
| 2014/0125332 A1 | 5/2014 | Lage et al. | |
| 2015/0168503 A1* | 6/2015 | Kim | G01R 33/18 |
| | | | 324/244 |
| 2015/0247904 A1* | 9/2015 | Piorra | G01R 33/09 |
| | | | 427/547 |
| 2018/0182951 A1* | 6/2018 | Burssens | H10N 35/85 |
| 2018/0299514 A1 | 10/2018 | Hayes et al. | |

OTHER PUBLICATIONS

Hayes P., et al. "Electrically modulated magnetoelectric AlN/FeCoSiB film composites for DC magnetic field sensing". Journal of Physics D: Applied Physics, Institute of Physics Publishing LTD., Bristol, GB, vol. 51, No. 35, Aug. 1, 2018 (2018-08-01), p. 354002, DOI:10.1088/1361-6463/AAD456, Issn 0022-3727, XP020330294.

* cited by examiner

MEASURING DEVICE FOR WEAK AND SLOWLY CHANGING MAGNETIC FIELDS, IN PARTICULAR FOR BIOMAGNETIC FIELDS

The invention relates to a device for measuring a magnetic field, having a cantilevered, mechanically vibratable, magnetic or magnetically-coated boom, further comprising drive means designed for temporally periodic excitation of a vibration of the boom with a predetermined excitation frequency and having a detection device for detecting an electrical signal generated by the vibration of the boom.

Devices of the generic type for measuring magnetic fields are known, for example, from the publications GB 2319621 A, US 2009/015250 A1, US 2018/299514 A1. The basic idea in all cases is to convert the influence of an external magnetic field to be measured—in the following referred to as measuring magnetic field—acting on mechanical properties of the magnetic or magnetically coated boom, into an electrical quantity and to record it as such. For the detection of very weak magnetic fields, it is customary to excite the boom to a mechanical resonance mode so that the measured variable is physically amplified when it is generated—i.e. before the technical implementation of the measured value acquisition. In the cited publications, for example, the temporal change in the magnetic flux in a coil, the deflection of a light beam reflected at the free end of the oscillating cantilever or the piezoelectric voltage generated in a piezoelectric layer on the deformed cantilever are detected as excessive resonance measured variables and, optionally, also converted into electrical signals and—usually digitized—continuously recorded.

The evaluation of the measured signals allows conclusions to be drawn about the resonance state of the oscillating boom at any point in time and thus allows changes in the mechanical properties of the boom to be determined. These are in turn attributed to the presence of a spatial measuring magnetic field component. The presence of a measuring magnetic field modulates the electrical signal of the boom in amplitude and/or frequency, and the modulation can be separated using known signal processing methods. By means of suitable calibration, the amplitude and frequency of the measuring magnetic field can be determined quantitatively with high sensitivity.

It is fundamentally noteworthy that small, compact measuring devices with mechanically oscillating arms with mechanical resonance frequencies in the high kilohertz range can be produced in MEMS design, which are also suitable for reliably detecting slowly changing measuring magnetic fields with frequencies in the order of 100 millihertz. This opens up the possibility of mass production of inexpensive, miniaturized magnetic field sensors that are able of detecting very weak, low-frequency magnetic fields such as those generated in living organisms.

Biomagnetic sensor arrays are a long-term goal of current research and development. In addition to the foreseeable expansion of medical diagnostics through the precise modeling of bioelectrical currents in cardiac or nerve cells based on magnetic field measurements, a wide field can open up for innovative human-machine interactions, which ultimately aim, for example, at the "thought control" of tools of all kinds.

Various sensor concepts are currently being investigated and tested. One of the most promising candidates is the magnetoelectric bimorph, which can be formed from a magnetoelectric (ME) composite as a bending beam clamped on one or both sides. The ME composite is composed of a piezoelectric material phase and a magnetostrictive material phase, which are firmly bonded to one another. Assuming suitable polarization or magnetization of the material phases, a measuring magnetic field causes a change in length in the magnetostrictive phase, which is transferred to the piezoelectric phase and generates a piezo voltage there. The bimorph bends and the piezo voltage provides a direct measure of the deflection.

The composite can be designed to be self-supporting, for example in that the magnetostrictive material phase is deposited as a thick layer on the—previously polarized—piezoelectric material phase as a substrate.

For example, complex and advantageous magnetostrictive layer systems can be produced by deposition with the imprinting of an exchange bias (EB) field, as described in the document US 2014/125332 A1. The self-supporting ME bending beams are created there by separating a coated wafer into strips, with knowledge of the direction of the EB field allowing the alignment of the long strip axis to be selected so that the strips have the maximum piezomagnetic coefficient.

In general, the ME bending beams are usually designed as strips, i.e. they are cuboids having a thickness T, a width W ("width"=strip width, also often referred to as the "length of the short axis") and a length L (the long axis), which have approximately the ratio $T:W:L=1:10:100$. The length L is typically several millimeters, sometimes a few centimeters. The term strip is used in this description for a cuboid, the side lengths of which differ from one another by approximately one or two orders of magnitude. Against this background, the strip is a flat, rectangular object that has two flat sides, both of which are spanned by the short and the long axis of the strip.

The ME bending beam sensor can also be formed from a substrate strip made of a dielectric material, on which the piezoelectric and magnetostrictive material phases are deposited as thin functional layers. The document US 2015/247904 A1 describes that the functional layers are applied to both sides of the substrate strip, i.e. the substrate material, for example several 100 micrometers thick silicon, is between a piezoelectric layer made of lead zirconate titanate (PZT) or aluminum nitride (AlN) and a magnetostrictive layer made of a magnetostrictive metal glass or arranged from the above-mentioned magnetostrictive layer system. The functional layers are only a few micrometers thick and their mechanical coupling is ensured through the thick substrate.

An ME bending beam sensor in the form of a strip is excited to vibrate in resonance modes for sensitive measurement of weak magnetic fields, which can be numerically calculated and illustrated using finite element methods (FEM). For strips clamped on one side, which are excited by the action of mechanical force along their thickness axis, i.e. here perpendicular to the functional layers on a substrate strip, the bending modes and the torsion modes are the most common and most likely.

The mass elements of the strips move in the resonant vibration predominantly along the direction of the exciting force, bending modes being characterized in that the mass elements oscillate in phase along the short axis at any point on the long axis of the strip. Higher bending modes have nodal lines along the short axis of the strip in which the mass elements are not deflected.

Torsional modes, on the other hand, show a nodal line in the middle of the strip along the long axis, and the mass elements of the strip move in antiphase along the short axis on either side of this nodal line. The clamped strip thus performs a kind of "shaking movement".

There is also a very unusual type of resonance mode in numerical simulation, which the inventors refer to with the name U-modes. They are shown graphically in FIGS. 1 a) and 1 b), namely as mode U1 without a node line and as mode U2 with a node line along the short axis of the strip, which is modeled as fixed in the figures with the black bar at the end. The U-modes show bending of the strip primarily along the short axis, i.e. each section through the strip perpendicular to the long axis has the more or less pronounced shape of a symmetrical arc open upwards or downwards, i.e. a U-shape.

To the knowledge of the inventors, the U-modes have not yet been associated with the measurement of magnetic fields by sensors with resonance oscillators.

In the publication Hayes et al., "Electrically modulated magnetoelectric AlN/FeCoSiB film composites for DC magnetic field sensing", 2018 J. Phys. D: Appl. Phys. 51 354002, by the inventors, a substrate strip made of silicon with a thickness of 350 micrometers on each side with 2 micrometer thick functional layers of $(Fe_{90}Co_{10})_{78}Si_{12}B_{10}$ as a representative of the magnetostrictive FeCoSiB metal glasses and sputtered aluminum nitride (AlN) between two metallic electrode layers as a piezoelectric material phase, respectively, is described and examined. The length of the strip is 25 millimeters, its width is 2.45 millimeters, and the thickness is approximately 0.354 millimeters. The strip is glued to a holder at one of its ends, so that a length of 23 millimeters protrudes and can swing freely. The excitation is carried out by a frequency generator using an electrical voltage that is applied to the piezo layer, which extends over the entire length of the strip.

Figure 2:
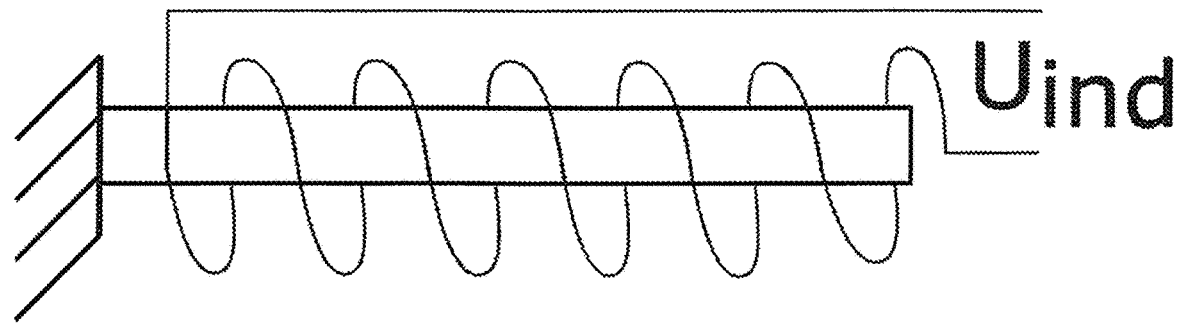

The vibrating strip is surrounded without contact by an induction coil, the coil axis of which is aligned along the substrate strip, i.e. along its long axis, as schematically sketched in FIG. 2. The movement of the vibrator is accompanied by the continuous deformation of the FeCoSiB layer and thus generates a change in the magnetic flux inside the induction coil over time. The voltage induced as a result is recorded as the output signal $U_{ind}$ of the coil.

Figure 3:
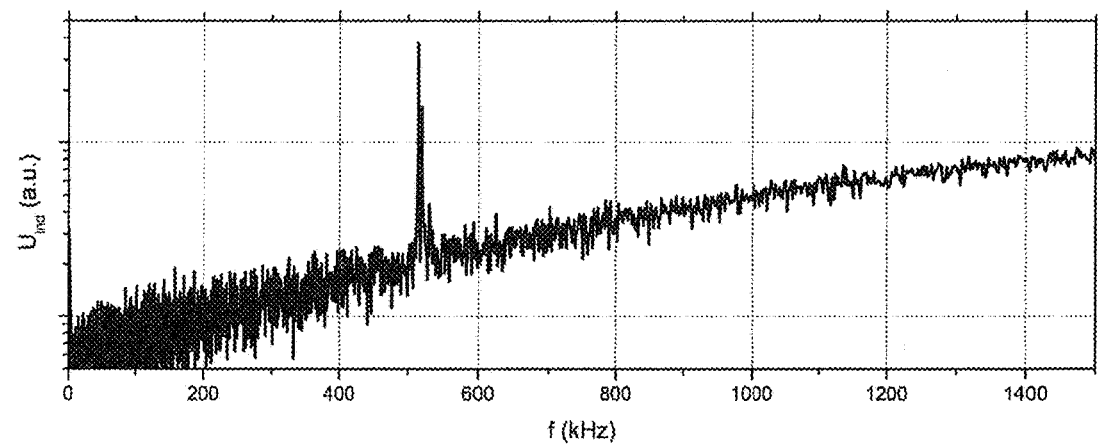

In FIG. 3, the strength of the output signal is shown in a new figure as a function of the excitation frequency over the frequency band 0-1.5 MHz. There are two clearly prominent peaks at 515.7 kHz and 520.7 kHz, as was already reported in the work by Hayes et al. Note the logarithmic scale for $U_{ind}$.

Figure 6:
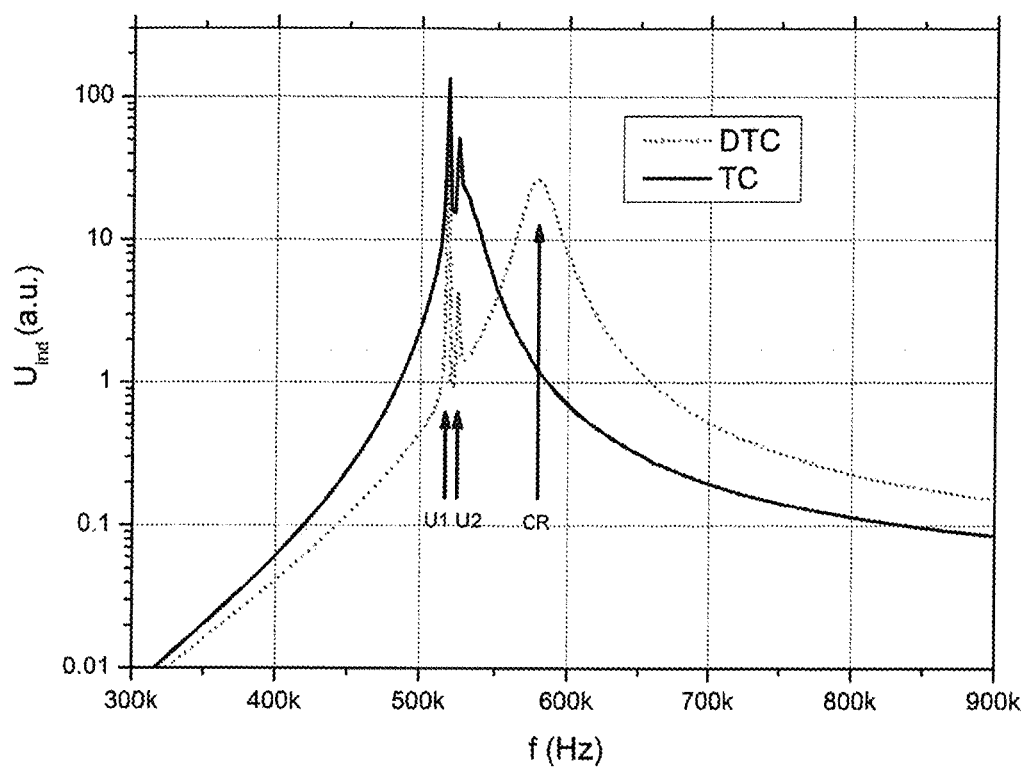

Hayes et al. examine the mechanical deformation of the strip at the frequencies found using optical vibrometry and summarize their findings in FIG. 6 of their report. You conclude from this that the present resonance vibration has a combination of known bending modes and torsion modes in both cases.

It is now the object of the invention to propose an improved magnetic field measuring device based on the principle of magnetic field sensitive, resonant vibration of a cantilever.

The object is achieved by a magnetic field measuring device having a cantilevered, mechanically vibratable, rectangular substrate strip, at least one flat side of the substrate strip being coated with a magnetostrictive material system, further comprising drive means designed for the temporally periodic exertion of a force component directed perpendicular to the flat sides of the substrate strip on at least a part of a flat side of the substrate strip with a predetermined excitation frequency, and having a detection device for detecting an electrical signal generated by the vibration of the substrate strip, wherein a. the substrate strip is formed from a material with a modulus of elasticity greater than 5 GPa and
b. the excitation frequency is set up as a function of the dimensions of the substrate strip in such a way that the substrate strip oscillates in mechanical resonance and forms a U-mode
c. the detection device has an induction coil which surrounds the substrate strip in a contactless manner and has a coil axis aligned along the substrate strip.

The subclaims give advantageous embodiments.

As a preliminary remark it should be said that the features a. and c. are customary per se and familiar to the person skilled in the art, but in combination with feature b. also to be seen as necessary here. Feature b. again, is easy to implement and a new key step in the design of improved magnetic field sensing devices.

Figure 1B:
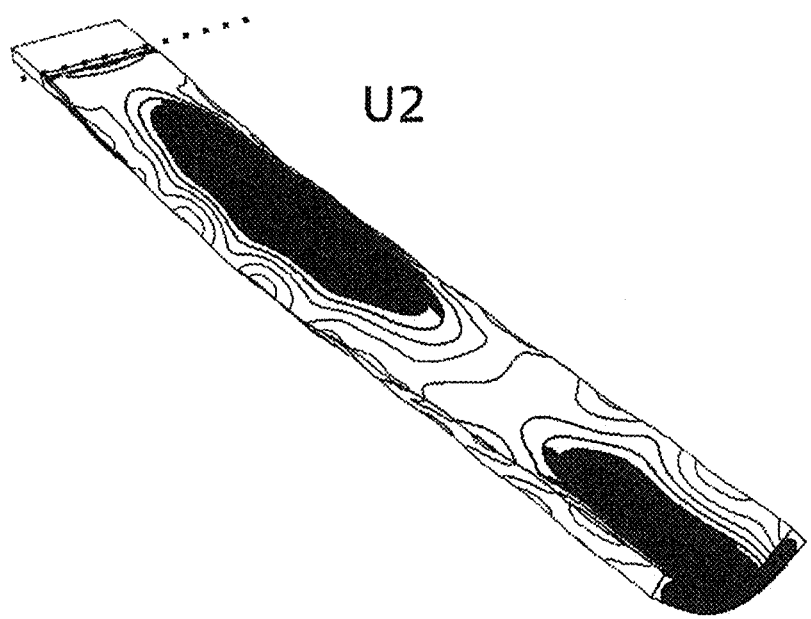
Figure 4:
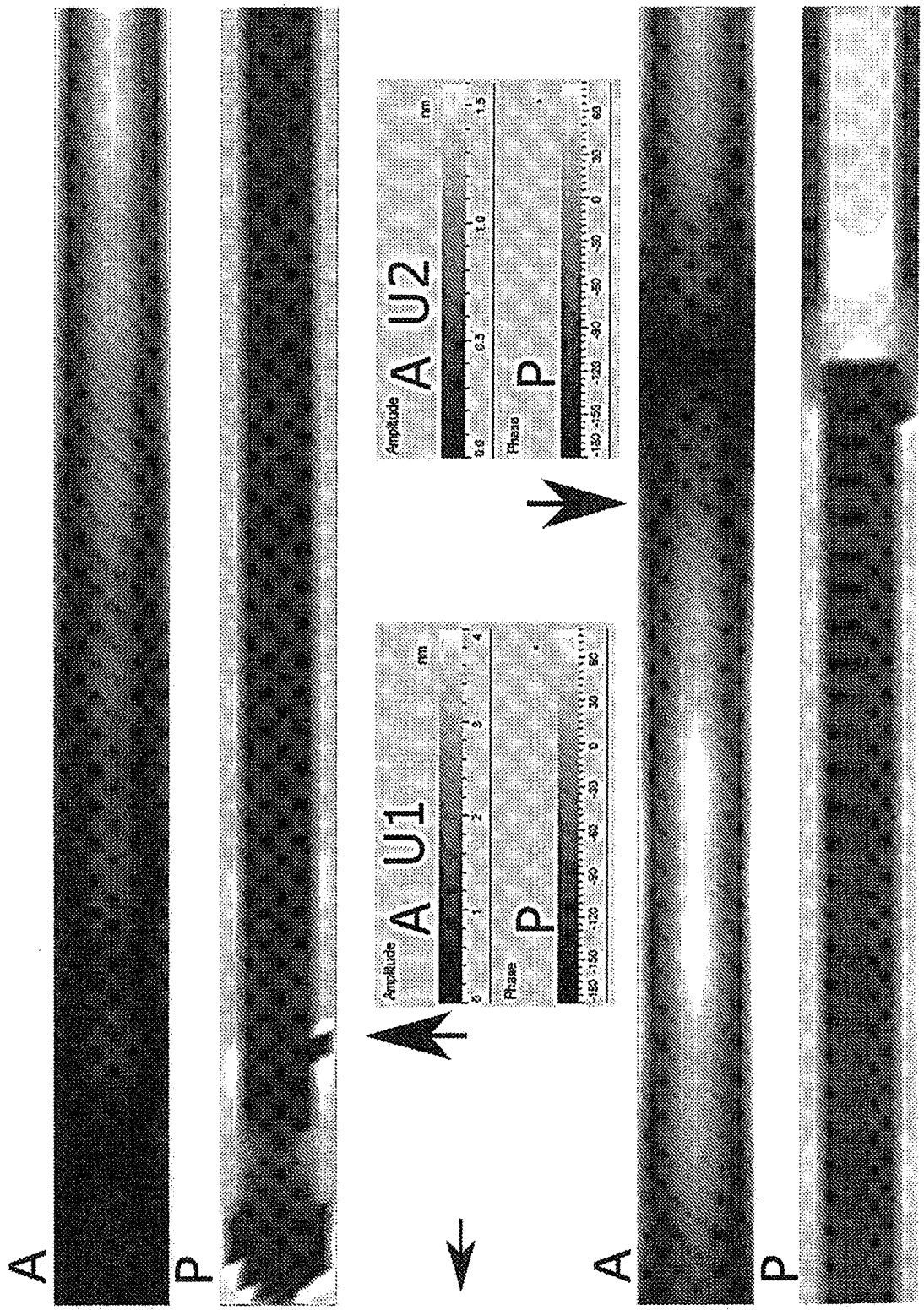
Figure 5A:
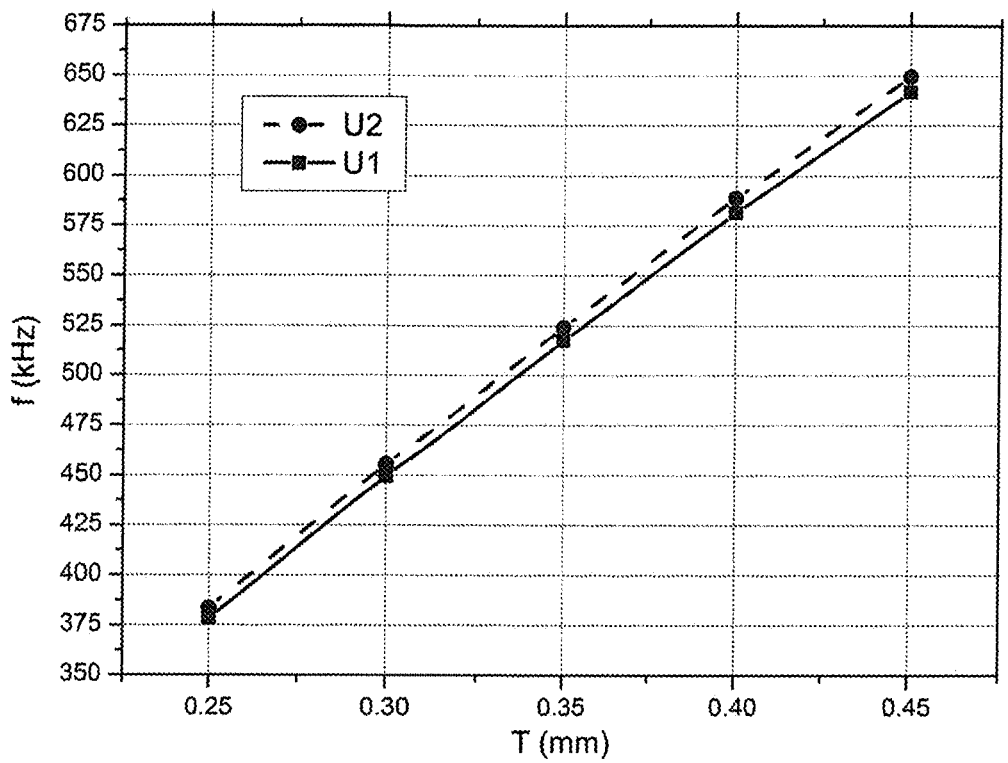
Figure 5B:
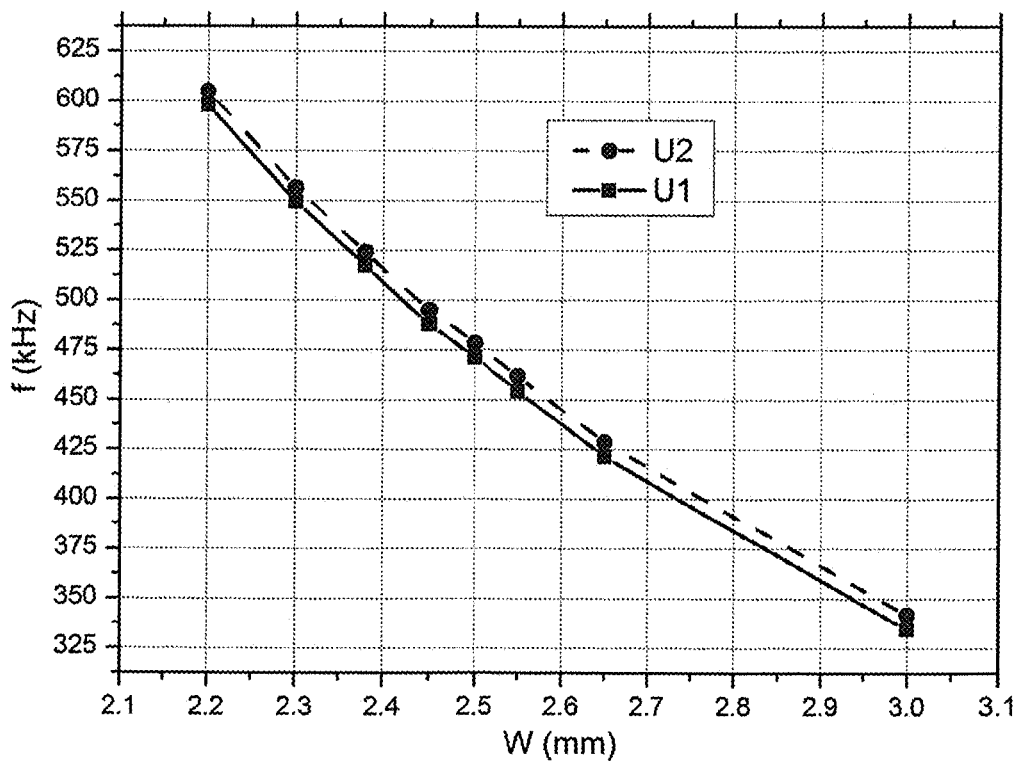
Figure 7:
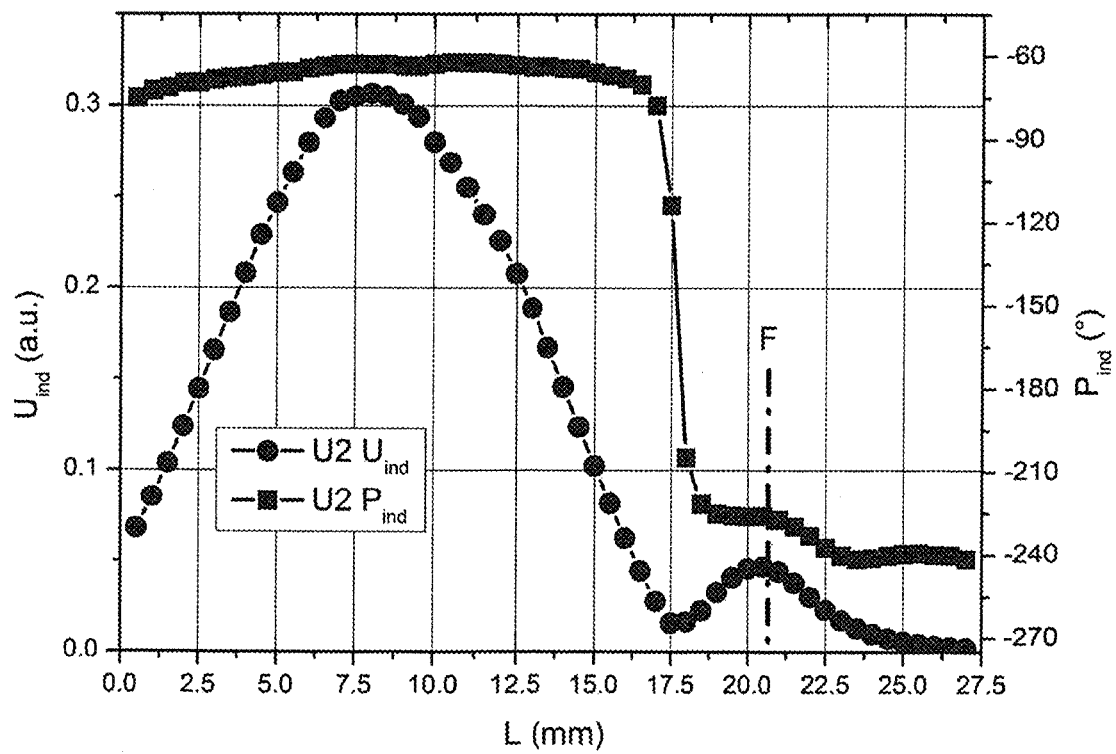

This is explained in more detail below using the figures. It shows:

FIG. 1 graphical representations of numerically simulated U-modes in the case of resonant strip vibrations, namely a) mode U1 without a node line and b) mode U2 with a node line along the short axis;

FIG. 2 a sketch of the measurement setup by Hayes et al. (state of the art);

FIG. 3 induced voltage measurement values at the output of the induction coil in the setup according to FIG. 2 over the frequency band 0-1.5 MHz;

FIG. 4 measurement data of the amplitudes and phases of the resonant vibration of the strip from Hayes et al. measured with high-precision laser vibrometry;

FIG. 5 frequencies of the occurrence of the U-modes U1 and U2 in the resonant vibration of the strip as a function of a) the thickness of the strip (calculated) and b) the width of the strip (calculated);

FIG. 6 effect of a capacitive trimming of the electrical resonance frequency of the induction coil;

FIG. 7 plot of the measured amplitudes and phases of mode U2 along the long strip axis.

It should first be noted that Hayes et al. erred in their work regarding the mechanical deformation of the sensor strip, as subsequent laser vibrometer measurements carried out in the meantime prove. The new measurement data are shown in FIG. 4 as grayscale plots and can be compared with FIG. 6 from the work by Hayes et al. The left arrow points to the clamping side of the strips. The more recent measurements were carried out by a working group specializing in surface vibrometry with their optimized equipment. A structurally identical sensor strip was used in the case of the Hayes et al. The frequencies found were 515.7 kHz and 520.7 kHz.

Hayes et al. did not fundamentally question their original—erroneous—measured values because they could be interpreted in accordance with the usual bending and torsional resonance modes that were previously known. The outstanding responsiveness of the sensor strip for the two frequencies mentioned, as shown in FIG. 3 of this description, was initially regarded as a special case that was noteworthy, but its cause could not be precisely justified. It has been found that the work by Hayes et al. thus leads in the wrong direction.

The measurement data in FIG. 4 initially gave the reason to numerically model the vibration behavior of a substrate strip made of silicon with one-sided clamping and force application perpendicular to the flat sides on the entire surface of one flat side. For this purpose, an existing software based on the finite element method (FEM) was used and adapted to the problem. The Hayes et al. sensor strip consists almost entirely of the substrate strip, i.e. the functional thin layers are not recognized as having any noteworthy effect on the mechanical modes.

The essential modeling result is shown in FIG. 1 of this description. The inventors discovered the U1 mode at 515.7 kHz and the U2 mode at 520.7 kHz, now in line with the measurements in FIG. 4. The U1 and U2 modes are the only so-called U-modes that were found in the examined frequency band 0-1.5 MHz.

The U-modes are easily recognizable in that they bring about a maximum bending of the substrate strip along its short axis, which requires very considerable forces. In fact, it was found in the experiment that the amplitude of the excitation can be increased to such an extent that the substrate strip breaks through along its long axis. It is these pronounced curvatures or warping of the substrate strip that are also transferred to the magnetostrictive functional layer and thus cause the outstanding resonance amplification of the sensor.

The basic idea of the present invention is therefore to promote the formation of U-modes on substrate strips in magnetic field measuring devices with magnetostrictive or magnetostrictively coated resonance oscillators and then to use them.

FEM modeling is again the most suitable means of choice for finding and realizing U-modes for various magnetic field measuring devices. On the basis of their property of the occurrence of extreme curvatures along the short strip axis, the calculated resonance modes can easily be separated into U-modes and others, and it is found that the modes U1 and U2 can be specifically excited in a wide geometric variation of substrate strips.

FIGS. 5 a) and 5 b) show the first calculated results as points that can be easily interpolated. In the simulations, a silicon strip in the geometry of Hayes et al. was initially used, and then one of the dimensions was varied. FIG. 5 a) shows that a silicon substrate strip of thickness T from the interval 0.25-0.45 millimeters can be excited to modes U1 and U2 if the excitation frequency is appropriately adjusted to a value from the interval of approx. 380 kHz to approx. 640 kHz. In FIG. 5 b) the width W of the substrate strip is varied in the interval 2.2-3.0 millimeters, and the excitation frequency for the U modes decreases with increasing strip width from about 600 kHz to about 335 kHz.

The change in the excitation frequency with the strip length L is not shown because this turns out to be very minor in the modeling. It should be remembered that the introduction of force through the piezoelectric takes place on the entire surface of a flat side of the strip. The fact that the length of the unilaterally clamped, otherwise freely oscillating strip only plays a subordinate role is understandable on the one hand and helpful for practical attachment to a holding body on the other, since the accuracy of the length of the adhesive bond is rather less important.

The previous explanations are intended to make it clear that the U modes are a special case of resonance modes of vibrating substrate strips, but by no means are they limited to a predetermined material system or a predetermined strip geometry. Rather, they are widely available and can be specifically sought out and implemented. The excitation frequencies of the U modes, however, are far above those frequencies for which the flexural oscillators are usually designed. For example, the Hayes et al. his first resonant bending modes already at 1 kHz and 5 kHz.

The FEM model calculations indicate that the U-modes cannot be set for substrate strips that can be deformed too easily. When simulating the resonance modes of a substrate strip made of a plastic with a modulus of elasticity of 5 GPa, no U-modes could be modeled. It is assumed that polymers are generally unsuitable as a substrate material to induce U-modes. The greatest modulus of elasticity for polymers is 20 GPa, so that the substrate material should preferably have a value higher than 20 GPa. The substrate strip is particularly preferably formed from a ceramic, a semiconductor or from a glass, in particular from materials with a modulus of elasticity greater than 75 GPa. In a particularly preferred embodiment, the substrate strip is formed from a monocrystalline semiconductor, very particularly preferably from silicon. In experiments it was also checked whether the entire surface covering of the substrate strip with a piezoelectric functional layer as a drive means for exciting the resonant strip vibration is a necessity for generating U-modes. However, this is not the case; the introduction of a force component perpendicular to the flat sides on a partial surface of a flat side is sufficient to generate U-modes.

The presence of the prominent peaks at 515.7 kHz and 520.7 kHz in FIG. 3 was used for assessment while the coverage with the piezo layer was reduced to about 30% of the area of the substrate strip. The coating was applied to the clamping side immediately starting at the mechanical clamp. This is considered to be the "worst" choice of the partial area of the strip that is to carry the piezo drive. In this respect, an excitation on 30% of the strip area appears in principle to always be sufficient.

The knowledge that a vibration excitation over a partial area of the strip is sufficient to form the U-mode is important in practice because in many cases the vibration energy is to be introduced into the strip from the clamping side. For this purpose, drive devices such as piezotransducers or electrostatic micro-drives, which are controlled by electrical frequency generators, are arranged on the holding body. One thus has greater freedom in the selection and arrangement of the drive means and, in particular, is not dependent on using a classic ME bimorph as a strip oscillator. Nevertheless, it is considered a preferred embodiment that the drive means comprise an electrical frequency generator and at least one piezotransducer, the at least one piezotransducer being arranged on the flat side of the substrate strip which is opposite the flat side coated with the magnetostrictive material system. The at least one piezo transducer is preferably designed as a thin layer, particularly preferably as a sputtered aluminum nitride between two metal layers. In this way, the piezotransducer does not block the bending of the substrate strip in the U-mode, but can apparently take part in the bending while maintaining good mechanical contact with the substrate material. In the embodiment as a thin layer, it is possible and advantageous that the at least one piezo transducer completely covers the flat side.

For the purpose of measuring the magnetic field, the detection of the changes in the magnetic flux generated by the U modes in the magnetostrictive material phase by means of induction coils is considered necessary. However, it is not essential that the induction coil surrounds the entire length of the vibrating strip at all times. In particular, it can be advantageous to provide a shorter coil which is arranged in the area of a previously known amplitude curve of the modes U1 or U2, or is moved to there.

In addition, there is the possibility of designing the induction coils to be particularly responsive to the U-modes targeted here by means of simple changes to the apparatus.

In addition to its inductance, every real coil also has ohmic and capacitive circuit components that must be taken into account in an equivalent circuit diagram. In particular, an open coil without a load or with a high-ohmic input resistance of an operational amplifier at the output is also an electrical resonant circuit with a natural frequency. The mechanical frequency of the strip oscillator and the electrical natural frequency of the coil are relatively close to one another here. This can be used to advantage.

FIG. 6 shows the induced coil voltage over the frequency band 300-900 kHz. The dotted line shows the two peaks of the modes U1 and U2 and a broad maximum CR, which comes from the electrical natural frequency of the coil at around 580 kHz (DTC—"de-tuned coil"). If you connect an additional, variable capacitance in parallel to the coil, you can thereby reduce the natural frequency, preferably to such an extent that the induction coil, as an electrical oscillating circuit, has a resonance frequency close to a mechanical resonance frequency of the substrate strip at which a U-mode is formed.

The electrical coil resonator is generally of poor quality and has a large half-width of the resonance peak (see FIG. 6, CR). The mechanical resonance frequency of the strip oscillator should preferably be within the half-width of the electrical coil resonance. The natural frequency of the coil should be brought correspondingly close to the frequencies of the U-modes by means of trimming.

In this way, the data of the solid line (TC—"tuned coil") in FIG. 6 is obtained as an induced voltage. Also note the logarithmic scale here: the measured values are increased by about an order of magnitude. Since the inevitable noise of the downstream measuring electronics is not recorded by this additional measure to increase the resonance, the signal-to-noise ratio increases accordingly considerably.

It is thus a preferred embodiment of the magnetic field measuring device that it has a trimming capacitor connected in parallel with the induction coil. It should be emphasized that trimming the capacitance connected in parallel presupposes that the resonance frequencies of the mechanical excitation and the electrical coil vibration are comparable before trimming, which is the case here especially for the U-modes.

In FIG. 7, the phase ($P_{ind}$) and amplitude ($U_{ind}$) of mode U2 measured with a movable short coil ring are plotted at 520.7 kHz along the long strip axis (clamping side is on the left). The length scale is shifted due to the measurement; for better orientation, the free end of the strip is marked by the vertical line with the notation F. The short coil ring generates localized measured values from the area around the strip segment that is currently in the center of the coil. It is very useful for finding node lines that are perpendicular to the long axis. Such is the case at the mark of around 17.5 mm, where the amplitude is minimal and the phase jumps by 180°. The exact position of the node line of U2 can be determined once for each sensor structure.

If an ordinary induction coil surrounds the strip oscillator over its entire length, then the anti-phase movement of the magnetic material on either side of the nodal line will cause voltages of opposite polarity to be induced simultaneously. As a result, the electrical output signal of the induction coil is weakened by this internal cancellation. To avoid this, the induction coil can be divided into coaxial, non-overlapping sub-coils. The sub-coils can measure separate, respectively localized induction voltages which, for example, can be recorded separately and then added according to their amount.

However, in order to keep the technical measurement effort and the noise sources low, a preferred embodiment of the magnetic field measuring device is that the substrate strip oscillating in mechanical resonance forms a U-mode with at least one node line and the induction coil consists of at least two coaxial, non-overlapping, series-connected partial coils, wherein each two adjacent partial coils each having opposite winding directions and are arranged on different sides of the at least one node line. In this way, the induced voltages in the series connection add up directly and can be recorded with maximum amplification.

The invention claimed is:

1. A magnetic field measuring device comprising a cantilevered, mechanically vibratable, rectangular substrate strip having a long axis and a short axis, at least one flat side of the substrate strip being coated with a magnetostrictive material system, further comprising drive means designed for temporally periodic exertion of a force component directed perpendicular to the flat sides of the substrate strip on at least part of a flat side of the substrate strip with a predetermined excitation frequency, and comprising a detection device for detecting an electrical signal generated by the vibration of the substrate strip, wherein
    the substrate strip is formed from a material with a modulus of elasticity greater than 5 GPa,
    the detection device has an induction coil which surrounds the substrate strip in a contactless manner and has a coil axis aligned along the substrate strip, and
    the predetermined excitation frequency is a function of the dimensions of the substrate strip such that the substrate strip oscillates in mechanical resonance and forms a U-mode, wherein a U-mode is a bending of the strip along the short axis in the shape of a symmetrical arc open upwards or downwards,
    wherein the substrate strip oscillates in mechanical resonance and forms a U-mode with at least one nodal line and the induction coil is formed from at least two coaxial, non-overlapping, series-connected partial coils, wherein each two adjacent partial coils have opposite winding directions and are arranged on different sides of the at least one node line.

2. The magnetic e field measuring device according to claim 1, wherein the substrate strip is formed from a material with a modulus of elasticity greater than 20 GPa.

3. The magnetic field measuring device according to claim 2, wherein the substrate strip is formed from a ceramic, a semiconductor or a glass.

4. The magnetic field measuring device according to claim 1, wherein the substrate strip is formed from a monocrystalline semiconductor.

5. The magnetic field measuring device according to claim 1, wherein the drive means comprise an electrical frequency generator and at least one piezo transducer, the at least one piezo transducer being arranged on a flat side of the substrate strip which is opposite the flat side coated with the magnetostrictive material system.

6. The magnetic field measuring device according to claim 5, wherein the at least one piezo transducer completely covers the flat side.

7. The magnetic field measuring device according to claim 5, wherein the at least one piezo transducer is sputtered aluminum nitride between two metal layers.

8. The magnetic field measuring device according to claim 1, wherein the substrate strip is formed from a material with a modulus of elasticity greater than 75 GPa.

9. The magnetic field measuring device according to claim 1, wherein the substrate strip is formed from silicon.

10. A magnetic field measuring device comprising a cantilevered, mechanically vibratable, rectangular substrate strip having a long axis and a short axis, at least one flat side of the substrate strip being coated with a magnetostrictive material system, further comprising drive means designed for temporally periodic exertion of a force component directed perpendicular to the flat sides of the substrate strip on at least part of a flat side of the substrate strip with a predetermined excitation frequency, and comprising a detection device for detecting an electrical signal generated by the vibration of the substrate strip, wherein the substrate strip is formed from a material with a modulus of elasticity greater than 5 GPa, the detection device has an induction coil which surrounds the substrate strip in a contactless manner and has a coil axis aligned along the substrate strip, and the predetermined excitation frequency is a function of the dimensions of the substrate strip such that the substrate strip oscillates in mechanical resonance and forms a U-mode, wherein a U-mode is a bending of the strip along the short axis in the shape of a symmetrical arc open upwards or downwards, wherein the substrate strip oscillates in mechanical resonance and forms a U-mode with at least one nodal line and the induction coil as an electrical oscillating circuit has a resonance frequency and the mechanical resonance frequency of the substrate strip, at which a U-mode is formed, lies within the half-width of the induction coil resonance.

11. The magnetic field measuring device according to claim 10, wherein the magnetic field measuring device has a trimming capacitor connected in parallel with the induction coil.

* * * * *